United States Patent
Sugimoto et al.

(10) Patent No.: US 9,530,703 B2
(45) Date of Patent: Dec. 27, 2016

(54) METHOD FOR MANUFACTURING SILICON CARBIDE SEMICONDUCTOR DEVICE

(71) Applicants: Hiroshi Sugimoto, Tokyo (JP); Takuyo Nakamura, Tokyo (JP)

(72) Inventors: Hiroshi Sugimoto, Tokyo (JP); Takuyo Nakamura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/434,279

(22) PCT Filed: Dec. 20, 2012

(86) PCT No.: PCT/JP2012/083083
§ 371 (c)(1),
(2) Date: Apr. 8, 2015

(87) PCT Pub. No.: WO2014/097448
PCT Pub. Date: Jun. 26, 2014

(65) Prior Publication Data
US 2015/0262892 A1    Sep. 17, 2015

(51) Int. Cl.
*H01L 21/66* (2006.01)
*H01L 25/18* (2006.01)
(Continued)

(52) U.S. Cl.
CPC ............ *H01L 22/20* (2013.01); *H01L 22/14* (2013.01); *H01L 25/18* (2013.01); *H01L 29/1608* (2013.01);
(Continued)

(58) Field of Classification Search
CPC ............ H01L 22/14; H01L 22/20; H01L 22/00–22/34; H01L 29/7803–29/7808
See application file for complete search history.

(56) References Cited

U.S. PATENT DOCUMENTS

2002/0121691 A1*  9/2002  Wojnarowski ......... H01L 22/20
                                                    257/734
2009/0168471 A1*  7/2009  Tsugawa ............ H01L 29/8611
                                                    363/56.01
(Continued)

FOREIGN PATENT DOCUMENTS

| JP | 2004-289023 A | 10/2004 |
| JP | 2009-044083 A | 2/2009 |
| JP | 2010-135573 A | 6/2010 |

OTHER PUBLICATIONS

Notification Concerning Transmittal of International Preliminary Report on Patentability and Translation of Written Opinion of the International Searching Authority; PCT/JP2012/083083 issued on Jul. 2, 2015.

(Continued)

*Primary Examiner* — Jessica Manno
*Assistant Examiner* — Sean Hagan
(74) *Attorney, Agent, or Firm* — Studebaker & Brackett PC (57) ABSTRACT

Provided is a method for manufacturing a silicon carbide semiconductor device capable of preventing an increase in a cost of manufacturing one chip while favorably maintaining forward characteristics of the semiconductor device including (a) inspecting the characteristics of the forward conduction of body diodes as element structures; (b) classifying the body diode and the body diode as either a first group suitable for forward conduction or a second group unsuitable for forward conduction on the basis of an inspection result; and (c) manufacturing a silicon carbide semiconductor MOSFET that requires forward conduction using the body diode classified into the first group or manufacturing a silicon (Continued)

carbide semiconductor MOSFET that does not need forward conduction using the body diode classified into the second group.

7 Claims, 4 Drawing Sheets

(51) Int. Cl.
    *H01L 29/16*     (2006.01)
    *H01L 29/78*     (2006.01)

(52) U.S. Cl.
    CPC .... *H01L 29/7805* (2013.01); *H01L 2924/0002* (2013.01)

(56) References Cited

U.S. PATENT DOCUMENTS

2010/0283126 A1\* 11/2010 Kiriyama ................ H01L 22/14
    257/617
2011/0242312 A1\* 10/2011 Seki ........................ H01L 22/12
    348/125

OTHER PUBLICATIONS

International Search Report; PCT/JP2012/083083; Mar. 19, 2013.
An Office Action issued by the State Intellectual Property Office of the P.R.C. on Aug. 23, 2016, which corresponds to Chinese Patent Application No. 201280077851.5 and is related to U.S. Appl. No. 14/434,279; with partial English language partial translation.

\* cited by examiner

FIG. 5

METHOD FOR MANUFACTURING SILICON CARBIDE SEMICONDUCTOR DEVICE

TECHNICAL FIELD

The present invention relates to a method for manufacturing a silicon carbide semiconductor device having a structure that performs a bipolar operation in a silicon carbide semiconductor element.

BACKGROUND ART

Silicon carbide semiconductor devices having structures that include pn junctions and perform bipolar operations have conventionally had problems that in a case where currents flow in a forward direction of the pn junctions, recombination currents of the pn junctions expand a lamination defect due to a crystal defect, resulting in an increase in a resistance of the forward characteristics. The crystal defect causing the lamination defect is formed in steps of manufacturing semiconductor substrates and epitaxial layers on the semiconductor substrates.

For example, Japanese Patent Application Laid-Open No. 2010-135573 proposes a technique for observing location coordinates of a crystal defect in a substrate by an optical microscope or the like in advance to prevent the crystal defect included in an epitaxial layer of the semiconductor device and for forming an element region in a position that avoids the location coordinates of the crystal defect.

PRIOR ART DOCUMENT

Patent Document

Patent Document 1: Japanese Patent Application Laid-Open No. 2010-135573

SUMMARY OF INVENTION

Problems to be Solved by the Invention

However, the proposed conventional technique removes, as a defective product, a semiconductor chip of the portion having the crystal defect formed therein. Thus, yields are decreased and a cost of manufacturing one chip is increased by the amount of removed chips.

The present invention has been made in view of the above-mentioned problems, and an object thereof is to provide a method for manufacturing a silicon carbide semiconductor device capable of preventing the increase in the cost of manufacturing the one chip while favorably maintaining forward characteristics of the semiconductor device.

Means for Solving the Problems

A method for manufacturing a silicon carbide semiconductor device that has an element structure including an epitaxial layer of a first conductivity type formed on a silicon carbide semiconductor substrate of a first conductivity type and an impurity layer of a second conductivity type formed in contact with the epitaxial layer, the method according to one aspect of the present invention including the steps of: (a) inspecting characteristics of a forward conduction between the epitaxial layer and the impurity layer in the element structure; (b) classifying the element structure as a first group suitable for the forward conduction or a second group unsuitable for the forward conduction on the basis of an inspection result of the step (a); and (c) manufacturing the silicon carbide semiconductor device that needs the forward conduction in the element structure using the element structure of the first group or manufacturing the silicon carbide semiconductor device that does not need the forward conduction in the element structure using the element structure of the second group.

A method for manufacturing a silicon carbide semiconductor device that has an element structure including an epitaxial layer of a first conductivity type formed on a silicon carbide semiconductor substrate of a first conductivity type and an impurity layer of a second conductivity type formed in contact with the epitaxial layer, the method according to another aspect of the present invention including the steps of: (a) inspecting characteristics of a forward conduction between the epitaxial layer and the impurity layer in the element structure; (b) manufacturing the silicon carbide semiconductor device using the element structure; and (c) classifying the silicon carbide semiconductor device that has been manufactured as the silicon carbide semiconductor device having the element structure of a first group suitable for the forward conduction or the silicon carbide semiconductor device having the element structure of a second group unsuitable for the forward conduction on the basis of an inspection result of the step (a).

Effects of the Invention

According to the above-mentioned aspects of the present invention, the element structure (or the silicon carbide semiconductor device) is classified as the element structure of the first group (or the silicon carbide semiconductor device having the element structure of the first group) or the element structure of the second group (or the silicon carbide semiconductor device having the element structure of the second group), and the silicon carbide semiconductor device is manufactured according to each use. Thus, the silicon carbide semiconductor device can be manufactured by effectively using the element structure unsuitable for the forward conduction, so that the increase in the cost of manufacturing the one chip can be prevented while the forward characteristics of the silicon carbide semiconductor device for each use are favorably maintained.

These and other objects, features, aspects and advantages of the present invention will become more apparent from the following detailed description of the present invention when taken in conjunction with the accompanying drawings.

DESCRIPTION OF EMBODIMENTS

Hereinafter, embodiments of the present invention will be described with reference to the accompanying drawings.

First Embodiment

Manufacturing Method

Figure 1:
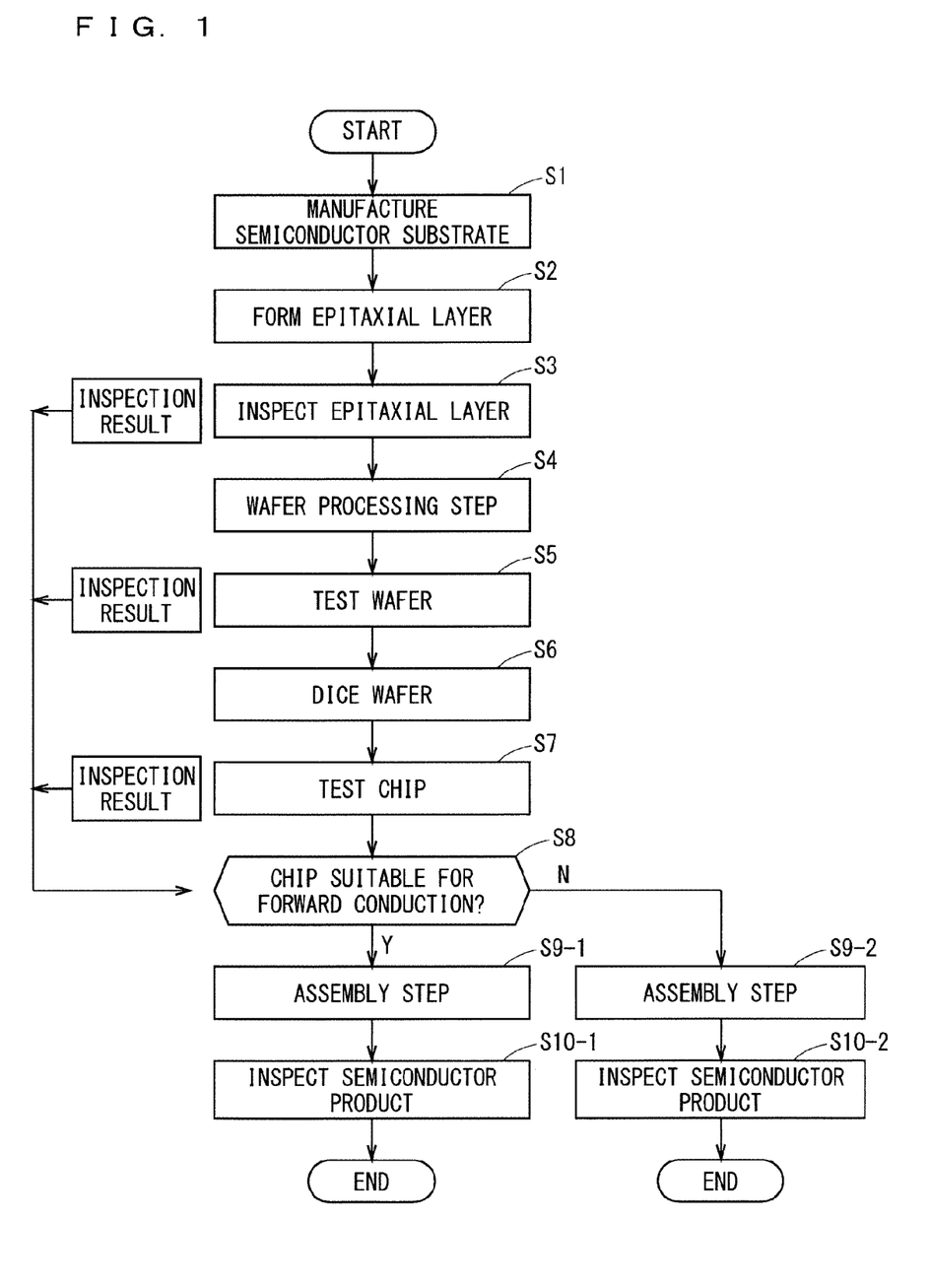
FIG. 1 is a flow chart illustrating an outline of a method for manufacturing a silicon carbide semiconductor device according to an embodiment of the present invention.

FIG. 1 is a flow chart illustrating an outline of a method for manufacturing a silicon carbide semiconductor device according to an embodiment of the present invention. In this embodiment, a silicon carbide semiconductor Metal-Oxide-Semiconductor Field-Effect Transistor (MOSFET) is assumed as an example of the semiconductor device.

First, a substrate manufacturing step of manufacturing a semiconductor substrate of a first conductivity type is performed (step S1). Specifically, a silicon carbide substrate is manufactured by an improved sublimation approach (improved Rayleigh approach). In addition, a commercial silicon carbide substrate that has been already manufactured may be bought and used in the following steps.

At this time, to suppress an expansion of a lamination defect occurring in a case where a current flows in a forward direction of a pn junction (forward conduction), the silicon carbide substrate having a low density of crystal defects including basal plane dislocation is preferably manufactured.

Next, an epitaxial layer manufacturing step of forming an epitaxial layer of a first conductivity type on the semiconductor substrate is performed (step S2). Specifically, the epitaxial layer is formed on the silicon carbide substrate by a chemical vapor deposition (CVD) process using hydrocarbon and silane gas. In addition, a silicon carbide substrate on which the epitaxial layer has already been formed may be bought and used in the following steps.

At this time, to suppress the expansion of the lamination defect occurring in the case where the current flows in the forward direction of the pn junction (forward conduction), a process of converting the basal plane dislocation into the other dislocation to reduce the density thereof, for example, is preferably performed.

Next, an epitaxial layer inspection step of inspecting initial characteristics of the epitaxial layer that has been formed is performed (step S3). Specifically, the epitaxial layer has an impurity density, a thickness, and a surface state evaluated by a nondestructive technique using a commercial inspection device. Moreover, the crystal defect including the basal plane dislocation of each wafer is observed. The basal plane dislocation is a linear defect that extends in an off-angle direction correspondingly to a length of the layer thickness of the epitaxial layer grown on the off-angle substrate. The observations are performed by, for example, a scanning photoluminescence technique or an X-ray topographic observation.

The inspection results are stored as inspection result data in a predetermined memory region (not shown). In addition, the inspections are performed in a wafer state.

Here, the crystal defect including the basal plane dislocation causes the expansion of the lamination defect. The expansion of the lamination defect causes an increase in a forward resistance of the semiconductor device, so that the semiconductor wafer having the low density of the crystal defects is preferably manufactured.

Moreover, the crystal defects including the basal plane dislocation are distributed in a concentrated manner and may be similarly distributed in the epitaxial layers of the plurality of silicon carbide semiconductor substrates of the same boule or the same lot. Such case eliminates the need to observe the crystal defects in the epitaxial layers of all the silicon carbide semiconductor substrates, and the observations may be replaced with observations of the crystal defects in part of the silicon carbide semiconductor substrates that are selected on the boule basis or the manufacturing lot basis. In this manner, the cost and the time for the inspections can be reduced, resulting in the reduced manufacturing costs.

Next, a wafer processing step of manufacturing a semiconductor element is performed (step S4). Specifically, a commercial semiconductor manufacturing device is used to repeat pattern expose and development, and furthermore, an etching, an ion (impurity) implantation, heat treatment, oxidation treatment, formation of an interlayer film, and formation of an electrode are performed, to thereby manufacture the silicon carbide semiconductor MOSFET on the semiconductor wafer.

Next, a wafer test step of evaluating the initial characteristics of the semiconductor wafer is performed (step S5). Specifically, the initial characteristics of the element are evaluated using a normal prober or the like. A leakage current in the semiconductor wafer is also measured. The test results are stored as the inspection result data in the predetermined memory region (not shown).

Next, a dicing step of dicing the semiconductor wafer to form semiconductor chips is performed (step S6). A normal dicer is used for the dicing.

Next, a chip test step of evaluating the initial characteristics of the semiconductor chip (semiconductor element) is performed (step S7). The test results are stored as the inspection result data in the predetermined memory region (not shown). The leakage current in the semiconductor chip is also measured. Moreover, a resistance value and the amount of change in resistance relative to conduction time are also measured in a case where a current of approximately 10 A/cm$^2$ flows, for example.

Next, the presence or absence of the increase in the forward resistance in a case of the forward conduction in the pn junction in the semiconductor chip is determined with reference to at least one of the inspection result data obtained in the previous steps. Then, if no forward resistance is determined to be increased, the semiconductor chip is assumed as a semiconductor chip of a first group suitable for the forward conduction. If the forward resistance is determined to be increased, the semiconductor chip is assumed as a semiconductor chip of a second group unsuitable for the forward conduction.

For example, with reference to the inspection result data of the epitaxial layer inspection step (step S3), the silicon carbide semiconductor substrate having the crystal defect in the epitaxial layer may be assumed as a semiconductor wafer unsuitable for the forward conduction.

Moreover, for example, with reference to the inspection result data of the wafer test step (step S5), the semiconductor wafer having abnormal rectifying characteristics of a body diode as an element structure and having the leakage current relatively greater than the normal distribution may be assumed as a semiconductor wafer unsuitable for the forward conduction.

Moreover, for example, with reference to the inspection result data of the chip test step (step S7), the semiconductor chip having the leakage current greater than the predetermined threshold value or having the amount of change in the forward resistance in the conductive state greater than the predetermined threshold value may be assumed as a semiconductor wafer unsuitable for the forward conduction.

Then, a classification step of classifying an use of the semiconductor chip according to each group is performed (step S8). By this classification, the semiconductor chip of the first group suitable for the forward conduction (Yes)

continues to a step of installing the semiconductor chip in the silicon carbide semiconductor device having specifications that need the forward conduction in the pn junction in the semiconductor chip, and the semiconductor chip of the second group unsuitable for the forward conduction (No) continues to a step of installing the semiconductor chip in the silicon carbide semiconductor device having specifications that do not need the forward conduction in the pn junction in the semiconductor chip.

Next, an assembly step of fixing each of the semiconductor chip of the first group and the semiconductor chip of the second group to a case or a mold to form wiring is performed (step S9-1 and step S9-2). In addition, the step is performed in a chip state.

Next, a product inspection step of inspecting initial characteristics of each silicon carbide semiconductor device (product) that has been assembled is performed (step S10-1 and step S10-2). In this manner, the silicon carbide semiconductor device (product) is manufactured.

Figure 2:
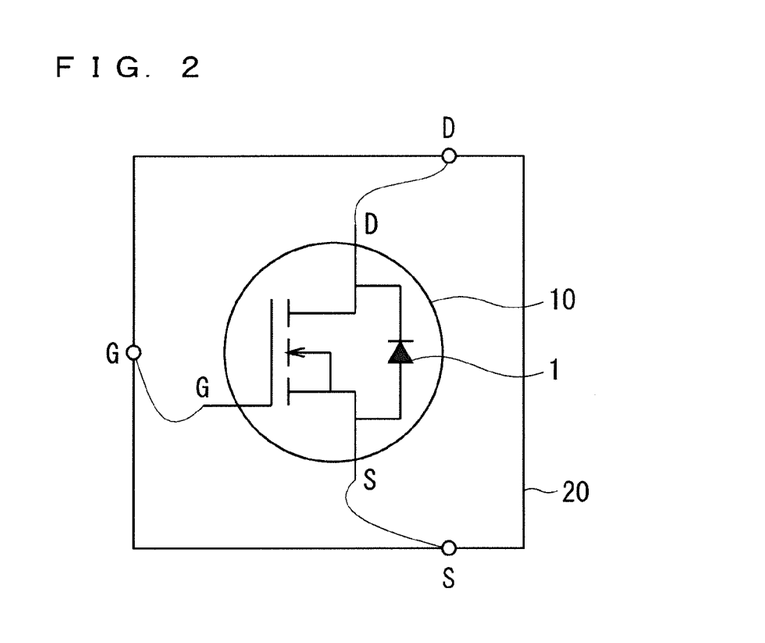
FIGS. 2 and 3 are diagrams illustrating examples of silicon carbide semiconductor MOSFETs that are manufactured.
Figure 3:
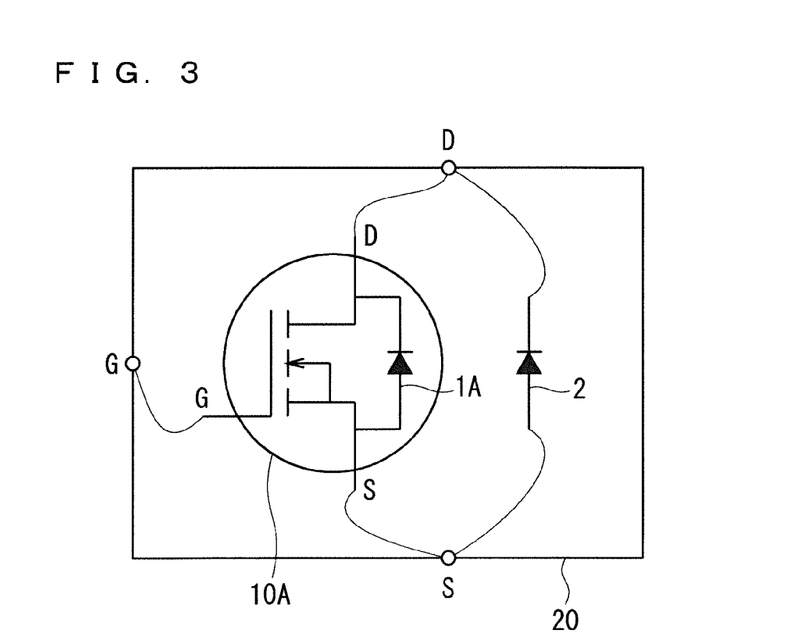

FIGS. 2 and 3 are circuit diagrams of silicon carbide semiconductor MOSFETs as an example of a silicon carbide semiconductor device that is manufactured.

FIG. 2 is the circuit diagram of a silicon carbide semiconductor MOSFET 10 including the semiconductor chip of the first group.

The silicon carbide semiconductor MOSFET 10 shown in FIG. 2 is disposed on a chip package 20. A body diode 1 in the silicon carbide semiconductor MOSFET 10 is suitable for the forward conduction, so that the silicon carbide semiconductor MOSFET 10 is manufactured as a silicon carbide semiconductor device having specifications that need the forward conduction in the pn junction.

Meanwhile, FIG. 3 is the circuit diagram of a silicon carbide semiconductor MOSFET 10A including the semiconductor chip of the second group.

The silicon carbide semiconductor MOSFET 10A shown in FIG. 3 is disposed on a chip package 20. A body diode 1A in the silicon carbide semiconductor MOSFET 10A is not suitable for the forward conduction, so that the chip package 20 further includes an SiC Schottky diode 2 thereon, the SiC Schottky diode 2 being connected in parallel to the body diode 1A of the silicon carbide semiconductor MOSFET 10A. The SiC Schottky diode 2 is arranged such that the forward direction thereof is in the same direction as the forward direction of the body diode 1A. In addition, an Si diode may be provided instead of the SiC Schottky diode 2.

The SiC Schottky diode 2 functions as a feedback diode (free-wheel diode) of the silicon carbide semiconductor MOSFET 10A. Thus, the increase in the forward resistance of the body diode 1A of the silicon carbide semiconductor MOSFET 10A does not contribute to the forward characteristics of the silicon carbide semiconductor MOSFET 10A.

<Modifications>

To simplify the manufacturing steps, any of the inspection steps (steps S3, 5, and 7) in FIG. 1 may only be performed. It should be noted that the classification step (step S8) can perform the classification with higher accuracy in a case of referring to more inspection result data.

The classification step (step S8) may be performed, for example, after the epitaxial layer inspection step (step S3) and before the wafer processing step (step S4) or may be performed after the wafer test step (step S5) and before the dicing step (step S6).

In this manner, the classification performed in the earlier step allows for a higher degree of flexibility in structural modifications.

If the classification is performed before the wafer processing step (step S4), the wafer processing step (step S4) can perform exposure treatment in which different exposure masks can be used for the first group and the second group, allowing for the formation of identification display so as to enable the distinction between the first group and the second group in a case of being divided by the dicing.

Moreover, if the classification is performed before the dicing step (step S6), the dicing step (step S6) can dice along the boundary between the first group and the second group. Thus, the first group and the second group can be suppressed to mix together in one semiconductor chip. Consequently, the silicon carbide semiconductor device can be manufactured using the least wasted semiconductor chip.

<Effects>

In this embodiment of the present invention, the method for manufacturing the silicon carbide semiconductor device includes the steps of: (a) inspecting the characteristics of the forward conduction of the body diode 1 and the body diode 1A as the element structures; (b) classifying the body diode 1 and the body diode 1A as the first group suitable for the forward conduction or the second group unsuitable for the forward conduction on the basis of the inspection result of the step (a); and (c) manufacturing the silicon carbide semiconductor device 10 that needs the forward conduction in the body diode 1 using the body diode 1 of the first group or manufacturing the silicon carbide semiconductor device 10A that does not need the forward conduction in the body diode 1A using the body diode 1A of the second group.

This configuration classifies the body diode 1 and the body diode 1A as the body diode 1 of the first group or the body diode 1A of the second group and manufactures the silicon carbide semiconductor MOSFET 10 and the silicon carbide semiconductor MOSFET 10A according to each use. Thus, the element structure unsuitable for the forward conduction is not regarded as a defective product and is effectively used to manufacture the silicon carbide semiconductor device, so that the increase in the cost of manufacturing one chip can be prevented while the forward characteristics of the silicon carbide semiconductor device for each use are favorably maintained.

Moreover, the forward characteristics of the element structure are classified before the silicon carbide semiconductor device is manufactured, and thus the following steps have a higher degree of flexibility in structural modifications.

In this embodiment according to the present invention, the different exposure masks are used in the case where the silicon carbide semiconductor MOSFET 10 including the body diode 1 of the first group is manufactured and in the case where the silicon carbide semiconductor MOSFET 10A including the body diode 1A of the second group is manufactured.

This configuration can form the identification display so as to enable the distinction between the body diode 1 of the first group and the body diode 1A of the second group. Thus, the first group and the second group are appropriately distinguished even in the case of being divided by the dicing in the following steps and can be prevented from being mixed together.

Furthermore, the embodiment according to the present invention further installs the SiC Schottky diode 2 that is connected in parallel to the body diode 1A and has the same forward direction as the forward direction of the body diode 1A in the case where the silicon carbide semiconductor MOSFET 10A using the body diode 1A of the second group is manufactured.

The SiC Schottky diode 2 functions as the feedback diode (free-wheel diode) of the silicon carbide semiconductor MOSFET 10A. Thus, the increase in the forward resistance of the body diode 1A of the silicon carbide semiconductor MOSFET 10A does not contribute to the forward characteristics of the silicon carbide semiconductor MOSFET 10A.

Furthermore, the embodiment according to the present invention includes the step of observing the crystal defect in the epitaxial layer by the scanning photoluminescence technique to inspect the characteristics of the forward conduction in the body diode 1 and the body diode 1A.

This configuration allows for the observation by the nondestructive technique that is different from the observation using a transmission type electron microscope or the like. This eliminates the need to prepare the semiconductor substrate for inspection. In addition, the device is relatively low-priced, and the inspection cost can be suppressed.

Additionally, the time and cost can be suppressed compared to the case where a screening is performed by the conduction to inspect the forward characteristics. Furthermore, this method can accurately inspect the crystal defect having a shape, size, or the like in which no noticeable difference appears by the conduction.

Furthermore, the embodiment according to the present invention includes the step of observing the crystal defect in the epitaxial layer by the X-ray topographic observation technique to inspect the characteristics of the forward conduction in the body diode 1 and the body diode 1A.

This configuration allows for the observation of detailed dislocation and the classification with higher accuracy.

Additionally, the time and cost can be suppressed compared to the case where the screening is performed by the conduction to inspect the forward characteristics. Furthermore, this method can accurately inspect the crystal defect having the shape, size, or the like in which no noticeable difference appears by the conduction.

Furthermore, the embodiment according to the present invention observes the crystal defect in the epitaxial layer on part of the silicon carbide semiconductor substrate that is selected on the boule basis or the manufacturing lot basis to inspect the characteristics of the forward conduction in the body diodes.

This configuration can efficiently perform the inspection and reduce the inspection cost and the inspection time.

Second Embodiment

Manufacturing Method

Figure 4:
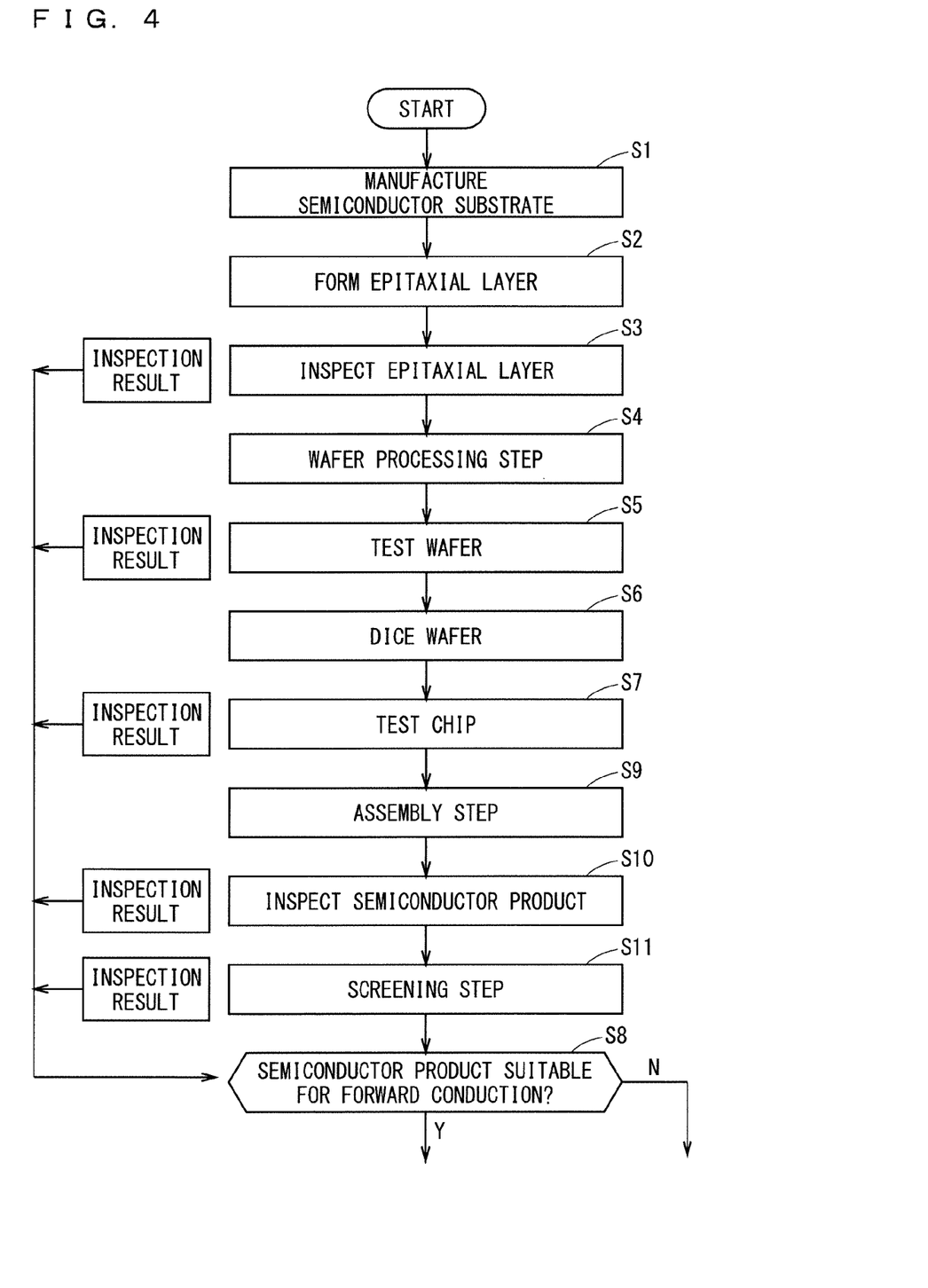
FIG. 4 is a flow chart illustrating an outline of a method for manufacturing a silicon carbide semiconductor device according to an embodiment of the present invention.

FIG. 4 is a flow chart illustrating an outline of a method for manufacturing a silicon carbide semiconductor device according to this embodiment. FIG. 4 shows the same steps S1 to 7 as those of the first embodiment, so that detailed description will be omitted.

After the step S7, an assembly step of fixing a semiconductor chip to a case or a mold to form wiring is performed (step S9).

Next, a product inspection step of inspecting initial characteristics of the silicon carbide semiconductor device (product) that has been assembled is performed (step S10). The inspection result is stored as inspection result data in a predetermined memory region.

Next, a screening step of inspecting the presence or absence of deterioration in a case of the forward conduction in a pn junction in the silicon carbide semiconductor device (product) is performed (step S11). Specifically, the presence or absence of an increase in the forward resistance is inspected by an initial conduction in which a body diode of the silicon carbide semiconductor device is energized in the forward direction. The inspection result is stored as the inspection result data in the predetermined memory region.

Next, with reference to at least one of the inspection result date obtained in the previous steps, a classification step of classifying an use according to each of the silicon carbide semiconductor device having an element structure of a first group suitable for the forward conduction and the silicon carbide semiconductor device having an element structure of a second group unsuitable for the forward conduction is performed (step S8). In this manner, the silicon carbide semiconductor device (product) classified according to each use is manufactured.

Figure 5:
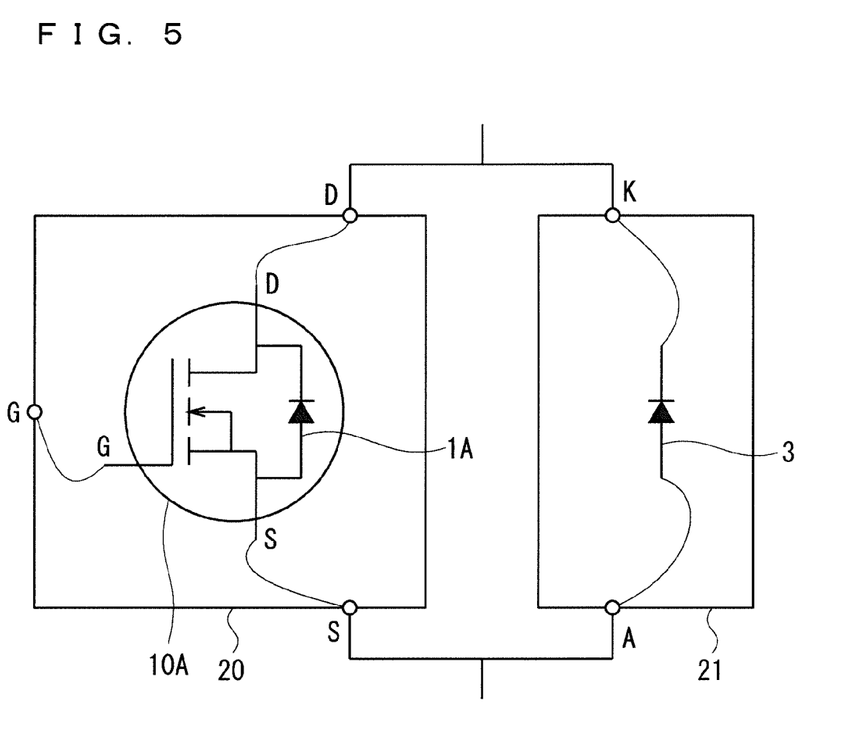
FIG. 5 is a diagram illustrating an example of a silicon carbide semiconductor MOSFET that is manufactured.

FIGS. 2 and 5 are the circuit diagrams of the silicon carbide semiconductor MOSFETs as an example of silicon carbide semiconductor devices that are each used or manufactured in the next step, which is not shown in FIG. 4, in cases of Yes and No in the step S8.

FIG. 2 is the circuit diagram of the silicon carbide semiconductor MOSFET 10 including the semiconductor chip of the first group in the case of Yes in the step S8.

The silicon carbide semiconductor MOSFET 10 shown in FIG. 2 is disposed on the chip package 20. The body diode 1 in the silicon carbide semiconductor MOSFET 10 is suitable for the forward conduction, so that the silicon carbide semiconductor MOSFET 10 is manufactured as a silicon carbide semiconductor device having specifications that need the forward conduction in the pn junction.

Meanwhile, FIG. 5 is the circuit diagram of a silicon carbide semiconductor MOSFET 10A including the semiconductor chip of the second group in the case of No in the step S8.

The silicon carbide semiconductor MOSFET 10A shown in FIG. 5 is disposed on a chip package 20. A body diode 1A in the silicon carbide semiconductor MOSFET 10A is unsuitable for the forward conduction, so that a chip package 21 different from the chip package 20 further includes a SiC Schottky diode 3 thereon, the SiC Schottky diode 3 being connected in parallel to the body diode 1A of the silicon carbide semiconductor MOSFET 10A. The SiC Schottky diode 3 is arranged such that the forward direction thereof is in the same direction as the forward direction of the body diode 1A. In addition, an Si diode may be provided instead of the SiC Schottky diode 3.

The SiC Schottky diode 3 functions as a feedback diode (free-wheel diode) of the silicon carbide semiconductor MOSFET 10A. Thus, the increase in the forward resistance of the body diode 1A of the silicon carbide semiconductor MOSFET 10A does not contribute to the forward characteristics of the silicon carbide semiconductor MOSFET 10A.

<Modifications>

To simplify the manufacturing steps, any of the inspection steps (steps S3, 5, 7, 10, and 11) in FIG. 4 may only be performed. It should be noted that the classification step (step S8) can perform the classification with higher accuracy in a case of referring to more inspection result data.

The classification step (step S8) may be performed after the product inspection step (step S10) and before the screening step (step S11). The classification performed in the earlier step allows for a higher degree of flexibility in structural modifications.

<Effects>

This embodiment of the present invention includes the steps of: (a) inspecting the characteristics of the forward conduction of the body diode 1 and the body diode 1A as the element structures; (b) manufacturing the silicon carbide semiconductor device 10 and the silicon carbide semiconductor device 10A using the body diode 1 and the body diode 1A, respectively; and (c) classifying the silicon carbide semiconductor device 10 and the silicon carbide semiconductor device 10A that have been manufactured as the silicon carbide semiconductor device 10 having the body diode 1 of the first group suitable for the forward conduction or the silicon carbide semiconductor device 10A having the body diode 1A of the second group unsuitable for the forward conduction on the basis of the inspection result of the step (a).

This configuration can increase the inspection result data that can be referred to and perform the classification with higher accuracy.

Each embodiment described above shows the example of the MOSFET that needs the body diode to be energized, for example, as the silicon carbide semiconductor device that needs the forward conduction in the pn junction. Similarly, in a method for manufacturing a silicon carbide semiconductor device of a type in which a pn junction of a thyristor, an IGBT, and a heterobipolar transistor, for example, is energized in the forward direction, the conduction in the pn diode eliminates a deteriorating element structure, achieving effects of improving reliability of the conduction.

Although the materials of the respective components, the conditions of implementation, and the like, are described in the embodiments of the present invention, the forgoing description is illustrative and not restrictive.

In addition, according to the present invention, the above embodiments can be arbitrarily combined, or each embodiment can be appropriately varied or omitted within the scope of the invention.

While the invention has been shown and described in detail, the foregoing description is in all aspects illustrative and not restrictive. It is therefore understood the numerous modifications and variations can be devised without departing from the scope of the invention.

DESCRIPTION OF NUMERALS

1, 1A body diode; 2, 3 SiC Schottky diode; 10, 10A silicon carbide semiconductor MOSFET; 20, 21 chip package.

The invention claimed is:

1. A method for manufacturing a silicon carbide semiconductor device that has an element structure including an epitaxial layer of a first conductivity type formed on a silicon carbide semiconductor substrate of a first conductivity type and an impurity layer of a second conductivity type formed in contact with said epitaxial layer, said method comprising the steps of:
   (a) inspecting characteristics of a forward conduction between said epitaxial layer and said impurity layer in said element structure;
   (b) classifying said element structure as a first group suitable for said forward conduction or a second group unsuitable for said forward conduction on the basis of an inspection result of said step (a); and
   (c) manufacturing a MOSFET device using said element structure of said first group and manufacturing a MOSFET device coupled to a Schottky diode using said element structure of said second group.

2. The method for manufacturing a silicon carbide semiconductor device according to claim 1, wherein said step (c) is a step of using different exposure masks in the case where said silicon carbide semiconductor device is manufactured using said element structure of said first group and in the case where said silicon carbide semiconductor device is manufactured using said element structure of said second group.

3. A method for manufacturing a silicon carbide semiconductor device that has an element structure including an epitaxial layer of a first conductivity type formed on a silicon carbide semiconductor substrate of a first conductivity type and an impurity layer of a second conductivity type formed in contact with said epitaxial layer, said method comprising the steps of:
   (a) inspecting characteristics of a forward conduction between said epitaxial layer and said impurity layer in said element structure;
   (b) classifying said element structure as a first group suitable for said forward conduction or a second group unsuitable for said forward conduction on the basis of an inspection result of said step (a); and
   (c) manufacturing said silicon carbide semiconductor device that needs said forward conduction in said element structure using said element structure of said first group and manufacturing said silicon carbide semiconductor device that does not need said forward conduction in said element structure using said element structure of said second group,
   wherein said step (c) is a step of further installing a diode that is connected in parallel to said element structure and has the same forward direction as the forward direction of said element structure in the case where said silicon carbide semiconductor device is manufactured using said element structure of said second group.

4. The method for manufacturing a silicon carbide semiconductor device according to claim 1, wherein said step (a) is a step of inspecting the characteristics of said forward conduction in said element structure by performing at least one of observation of a crystal defect in said epitaxial layer, measurement of a leakage current in said element structure, and measurement of time change in a forward resistance in a case where said element structure is energized in a forward direction.

5. The method for manufacturing a silicon carbide semiconductor device according to claim 4, wherein said step (a) includes a step of observing the crystal defect in said epitaxial layer by a scanning photoluminescence technique to inspect the characteristics of said forward conduction in said element structure.

6. The method for manufacturing a silicon carbide semiconductor device according to claim 4, wherein said step (a) includes a step of observing the crystal defect in said epitaxial layer by an X-ray topographic observation technique to inspect the characteristics of said forward conduction in said element structure.

7. The method for manufacturing a silicon carbide semiconductor device ac cording to claim 4, wherein said step (a) includes a step of observing the crystal defect in said epitaxial layer on part of said silicon carbide semiconductor substrate that is selected on a boule basis or a manufacturing lot basis to inspect the characteristics of said forward conduction in said element structure.

* * * * *